(12) United States Patent
Lenkersdorfer

(10) Patent No.: US 6,213,844 B1
(45) Date of Patent: Apr. 10, 2001

(54) METHOD FOR OBTAINING A DESIRED FILM THICKNESS USING CHEMICAL MECHANICAL POLISHING

(75) Inventor: Paul Lenkersdorfer, Mesa, AZ (US)

(73) Assignee: Speedfam-Ipec Corporation, Chandler, AZ (US)

( * ) Notice: Subject to any disclaimer, the term of this patent is extended or adjusted under 35 U.S.C. 154(b) by 0 days.

(21) Appl. No.: 09/277,261

(22) Filed: Mar. 26, 1999

(51) Int. Cl.[7] .............................. B24B 49/00; B24B 51/00
(52) U.S. Cl. ............................. 451/6; 451/45; 451/287
(58) Field of Search .................................. 451/5.6, 8, 41, 451/28, 285, 287, 288, 289, 63, 9, 10

(56) References Cited

U.S. PATENT DOCUMENTS

| Re. 34,425 | 11/1993 | Schultz . | |
|---|---|---|---|
| 5,081,796 | * 1/1992 | Schultz | ..................................... 451/8 |
| 5,948,203 | * 9/1999 | Wang | ................................... 451/287 |

* cited by examiner

Primary Examiner—Derris H. Banks
(74) Attorney, Agent, or Firm—Snell & Wilmer LLP

(57) ABSTRACT

Improved chemical mechanical polishing methods for removing material from a surface of a workpiece are disclosed. The workpiece is polished for a predetermined amount of time, the wafer is then moved to the perimeter of a polishing surface and film thickness measurements are obtained. The results from the film thickness measurements are used to adjust parameters for a subsequent polishing process.

9 Claims, 5 Drawing Sheets

METHOD FOR OBTAINING A DESIRED FILM THICKNESS USING CHEMICAL MECHANICAL POLISHING

FIELD OF THE INVENTION

The present invention generally relates to polishing a surface of a workpiece. More particularly, the invention relates to improved methods for obtaining a desired film thickness on a workpiece surface by removing an amount of the material using chemical mechanical processes.

BACKGROUND OF THE INVENTION

Chemical mechanical polishing or planarizing a surface of an object may be desirable for several reasons. For example, chemical mechanical polishing is often used in the formation of microelectronic devices on a surface of a semiconductor wafer to provide a substantially smooth, planar surface suitable for subsequent fabrication processes such as photoresist coating and pattern definition.

During microelectronic fabrication, several structures that protrude from the wafer surface such as metal lines or that are etched into the surface such as vias and trenches may be formed. To smooth the wafer surface, a film of material may be deposited onto the wafer surface. The topography of the deposited film generally follows the topography of the underlying surface. However, the surface of the film may be smoothed using chemical mechanical polishing that preferentially removes material from the peaks on the surface compared to material located elsewhere on the wafer surface.

Chemical mechanical polishing may also be used to form microelectronic features. For example, a conductive feature such as a metal line or a conductive plug may be formed on a surface of a wafer by forming trenches and vias on the wafer surface, depositing conductive material over the wafer surface and into the trenches and vias, and removing the conductive material on the surface of the wafer using chemical mechanical polishing, leaving the vias and trenches filled with the conductive material.

A typical chemical mechanical polishing apparatus suitable for planarizing the semiconductor surface generally includes a wafer carrier configured to support, guide, and apply pressure to the wafer during the polishing process; a slurry containing abrasive particles and chemicals to assist removal of material from the surface of the wafer; and a polishing pad configured to assist in the material removal.

The wafer surface is generally polished by moving the surface of the wafer to be polished relative to the polishing pad in the presence of the slurry. In particular, the wafer is placed in the carrier such that the surface to be polished is exposed and faces downward. The wafer is then placed in contact with the pad (which has usually already been exposed to the slurry) and the pad and the wafer are moved relative to each other while slurry is continuously supplied to the polishing pad. Although the pad and the wafer may move relative to each other in a variety of ways, typically, the carrier is configured to cause the wafer to rotate about an axis and to translate back and forth across the polishing pad. Additionally, the pad is typically attached to a platen that is configured to rotate about an axis. As the wafer rotates, the outside diameter of the wafer moves across the wafer surface at a higher velocity than the surface at the wafer's inside diameter. To compensate for the higher velocity at the outside diameter, the wafer is often caused to translate across the surface of the pad, past the outside diameter of the pad, such that for a portion of the polishing process, the outside diameter of the wafer is not exposed to the polishing pad. In other words, a portion of the wafer surface is translated off the pad surface such that the surface near the inside diameter is polished and the surface near the outside diameter of the wafer is not polished for a portion of the polishing cycle.

The amount of material removed during or left remaining after the polishing process is typically controlled by, among other things, running the polishing process for a predetermined amount of time. The amount of time may be adjusted from run to run based on material removal rates from one or more previous polishing runs, wherein the removal rates are calculated by measuring the film thickness prior to polishing the wafer and measuring the remaining film thickness after the completion of the polishing process. The film thickness is generally measured using a device such as an x-ray fluorescence machine that is separate from the polishing apparatus. Consequently, the film thickness is typically measured before the wafer is placed on the polishing apparatus and again once the wafer is removed from the apparatus.

Because polishing rates often vary from run to run and wafer to wafer within a run, and the pre-polish material thickness may vary from wafer to wafer, this method often yields wafers that have been polished for too long or for not enough time, which may result in low device yield or poor device performance. Accordingly, improved methods for controlling an amount of material remaining on the wafer surface are desired.

One method for improving control over the amount of material remaining on the surface after a chemical mechanical polishing process includes measuring the film thickness as the wafer is be being polished and stopping the polishing process when a desired film thickness is reached. A method and an apparatus for measuring the film thickness during the polishing process is disclosed in U.S. Pat. No. Re. 34,425 issued to Schultz on Nov. 2, 1993. The method disclosed in the Schultz patent uses laser interferometry to measure a film thickness on a non-patterned die or dies located at the perimeter of the wafer surface. The measurements are taken each time a portion of the wafer oscillates off the polishing pad, allowing the portion to be exposed to the laser. This method is advantageous, because the polishing process may be stopped when a desired amount of material is removed from the wafer surface or when a desired film thickness is obtained rather than polishing the wafers for a predetermined amount of time. However, this method may be problematic in several regards. In particular, when lasers are used to measure film thicknesses, it is often difficult to differentiate the film thickness on the wafer surface and the thickness of the film in the trench. Accordingly, preferred methods in the Schultz patent include measuring the film thickness on a non-patterned portion of the wafer surface. Using non-patterned structures on the wafer surface reduces the number of devices that may otherwise be formed on the wafer. Accordingly, methods and apparatus for measuring a film thickness that do not require additional non-patterned areas on the wafer surface are desired.

In addition, because the measurements are taken while the wafer is being polished, the measurements are taken only at the very outside diameter of the wafer, typically across an arc portion of the wafer surface at the outside diameter. The surface area of the wafer where measurements are taken is limited, in part, because the wafers are forced against the polishing pad while the wafers are polished, and if the wafers extend too far beyond the outside diameter of the polishing platen, they are susceptible to breakage. Measuring film thickness only over a portion of the wafer at the outside diameter of the wafer may be undesirable because, among other reasons, the thickness at the portion of the outside diameter may not be indicative of the film thickness at an interior portion of the wafer. Accordingly, improved methods and apparatus for polishing workpieces that allow for measurement over a greater surface area of the workpiece without increasing workpiece breakage is desired.

SUMMARY OF THE INVENTION

The present invention provides improved methods for chemically mechanically polishing a surface of a workpiece that overcome many of the shortcomings of the prior art. While the ways in which the present invention addresses the drawbacks of the now-known techniques for chemical mechanical polishing will be described in greater detail hereinbelow, in general, in accordance with various aspects of the present invention, the invention provides better film thickness measurements over a greater portion of the wafer surface while the wafer is coupled to a wafer carrier.

In accordance with an exemplary embodiment of the present invention, a wafer is polished by placing the wafer within a carrier, placing a surface of the wafer to be polished in contact with a polishing pad in the presence of a slurry, applying pressure to the wafer, and moving the wafer relative to the pad. The wafer is then moved away from the center of the polishing pad, proximate the perimeter of the polishing pad, and the pressure applied to the wafer is reduced. The wafer is then moved further away from the polishing pad center and film thickness measurements are taken.

In accordance with a further embodiment of the present invention, a vacuum is applied between the wafer and the carrier to secure the wafer as the wafer is moved further from the center of the polishing pad.

In accordance with yet a further embodiment of the present invention, the wafer is rotated while it is located at the perimeter of the polishing pad such that film thickness measurements may be obtained at a variety of locations on the wafer surface. According to an exemplary aspect of this embodiment, the wafer may continuously rotate while the thickness measurements are taken on the wafer surface.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

DETAILED DESCRIPTION OF EXEMPLARY EMBODIMENTS

The present invention generally relates to improved methods for removing material from a surface of a workpiece. In particular, the present invention relates to removal of material using chemical mechanical polishing. Although the present invention may be used to remove a variety of materials from a variety of substrates, the present invention is conveniently described below in connection with removal of dielectric materials, specifically silicon dioxide, from the surface of a semiconductor wafer.

Figure 1:
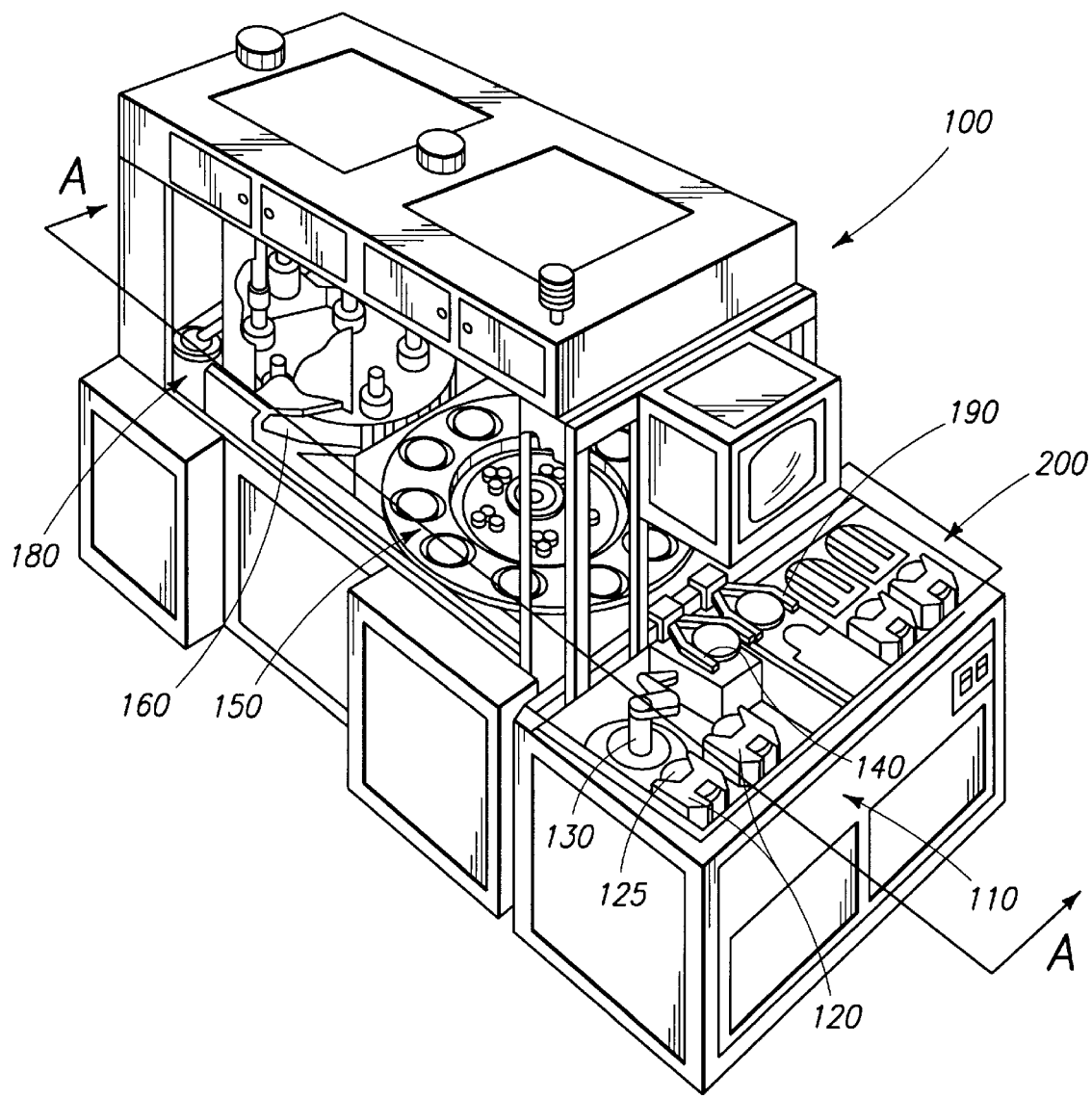
FIG. 1 is a schematic representation of a chemical mechanical planarization machine in accordance with the present invention.
Figure 2:
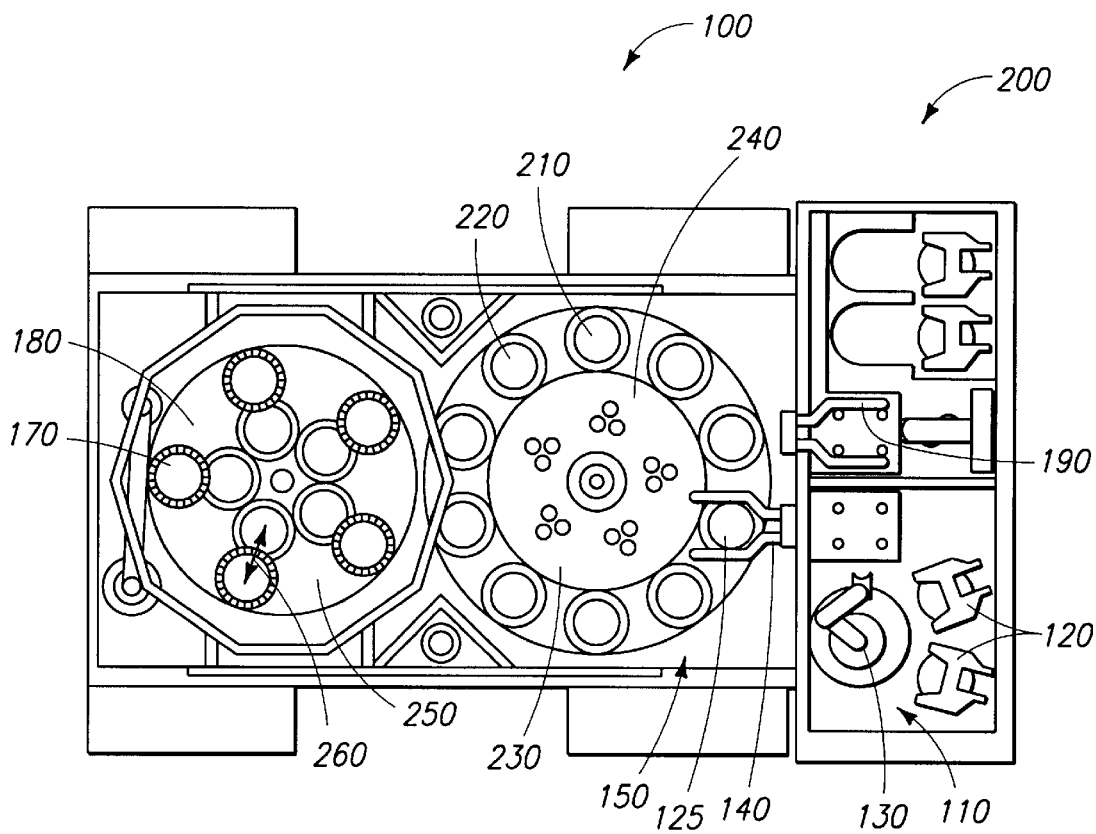
FIG. 2 is a top cross-sectional view of the machine shown in FIG. 1 taken along the lines A—A.

FIGS. 1 and 2 illustrate a chemical mechanical polishing machine 100 in accordance with the present invention. Machine 100 is suitably configured to transport a workpiece to a polishing surface and polish the workpiece until a desired thickness of material remains on the workpiece surface or until a desired amount of material is removed from the workpiece surface. In accordance with a preferred embodiment of the present invention machine 100 is an Auriga machine manufactured by SpeedFam Corporation of Illinois. However, machine 100 may be any machine capable of removing material from a workpiece surface. For example, machine 100 may be a belt driven or orbital polishing apparatus.

In accordance with the exemplary embodiment shown in FIGS. 1 and 2, machine 100 includes a load station 110 configured to receive a cassette of wafers 120, a loading robotic arm 130 configured to remove a wafer 125 from cassette 120 and transport wafer 125 to a transfer arm 140, a wafer transition station 150 configured to receive wafer 125 from arm 140, a multihead carrier apparatus 160 having multiple individual wafer carriers 170 attached thereto, a polishing station 180, an unloading transport arm 190 and an unload station 200.

In operation, cassette 120 is placed onto load station 110, wafer 125 is removed from cassette 120 using loading robotic arm 130 and transferred to transfer arm 140. Transfer arm 140 transfers wafer 125 and deposits wafer 125 in a receiving station 210. This process continues until a desired number of wafers are deposited in their respective receiving stations 210. Next, multihead wafer transport apparatus 160 moves over wafer transition station 150 and is lowered to allow wafers 125 to be received by and coupled to respective individual carriers 170. Multihead wafer transport apparatus then transports wafers 125 to polishing station 180, where wafers 125 are polished as desired.

Wafer transition station 150 suitably includes alternating receiving stations 210 and discharge stations 220 to facilitate the transfer of wafers between load station 110, polishing station 180, and unload station 200. In addition, transition station 150 may include a secondary polishing station 230 that includes polishing material 240. Secondary polishing station 230 may suitably include a film thickness measurement apparatus as described in more detail below in connection with polishing station 180.

Polishing station 180 generally includes a platen 300 (shown in FIG. 3) and a polishing material such as a polishing pad 250. Platen 300 is configured to rotate about an axis such that pad 250 moves relative to apparatus 160. Although polishing pad 250 and platen 300 may be formed into a variety of shapes, in accordance with a preferred embodiment of the present invention, platen 300 has a circular cross section with a diameter of about 32 inches, and pad 250 has an annular shape having an inside diameter of about 15 inches and an outside diameter of about 32 inches.

Multihead wafer transport apparatus 160 generally includes one or more individual wafer carriers 170 configured to move and place wafer 125 in contact with polishing pad 250, apply pressure to wafer 125, couple to wafer 125 (e.g., apply a vacuum between wafer 125 and the carrier), and move wafer 125 relative to pad 250. In particular, carrier 170 is configured to apply a vacuum between carrier 170 and wafer 125 during wafer transfer between transition station 150 and polishing station 180 and during film thickness measurement operation as describe below. To cause wafer 125 to move relative to pad 250, carrier 170 is configured to cause wafer 125 to rotate about its central axis and to translate back and forth over pad 250 as illustrated by arrow 260.

Figure 3:
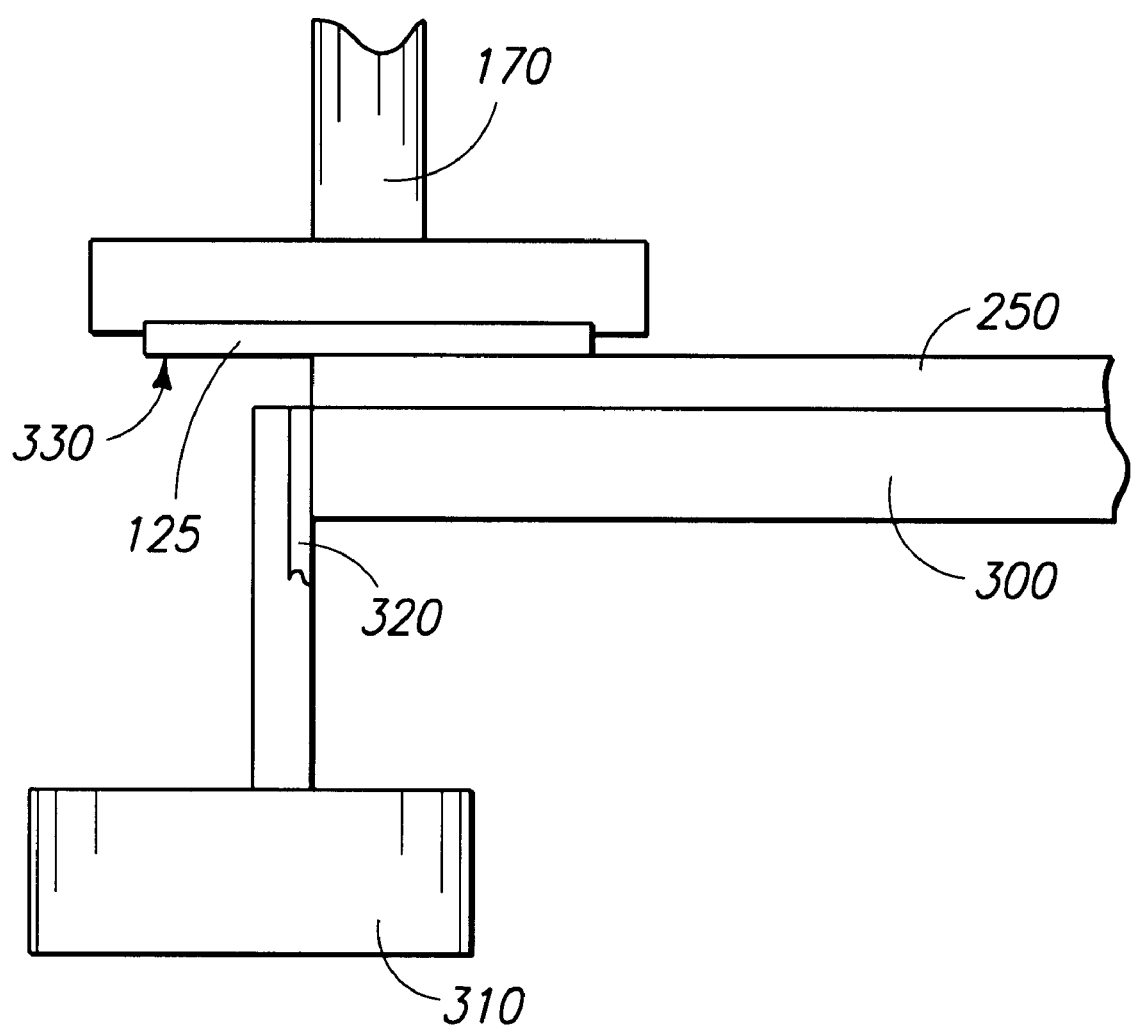
FIG. 3 is a side view of a portion of the machine of FIG. 1, showing a wafer surface in position for film thickness measurement in accordance with the present invention.

In accordance with an exemplary embodiment of the present invention, machine 100 includes a film thickness measurement device 310, schematically illustrated in FIG. 3. Device 310 may include any device capable of measuring film or material thicknesses and may vary from application to application. However, in accordance with a preferred embodiment of the present invention, device 310 includes an Altair system manufactured by Mission Peak Optics and uses white light with wavelengths ranging from about 200 to about 1200 nanometers. Using a device that uses white light allows film thickness measurements over patterned areas (e.g., over devices formed) on the surface of wafer 125. In other words, the various light wavelengths allow device 310 to differentiate film thickness on wafer 125 surface and the film thickness over various features on wafer 125 surface.

Figure 4:
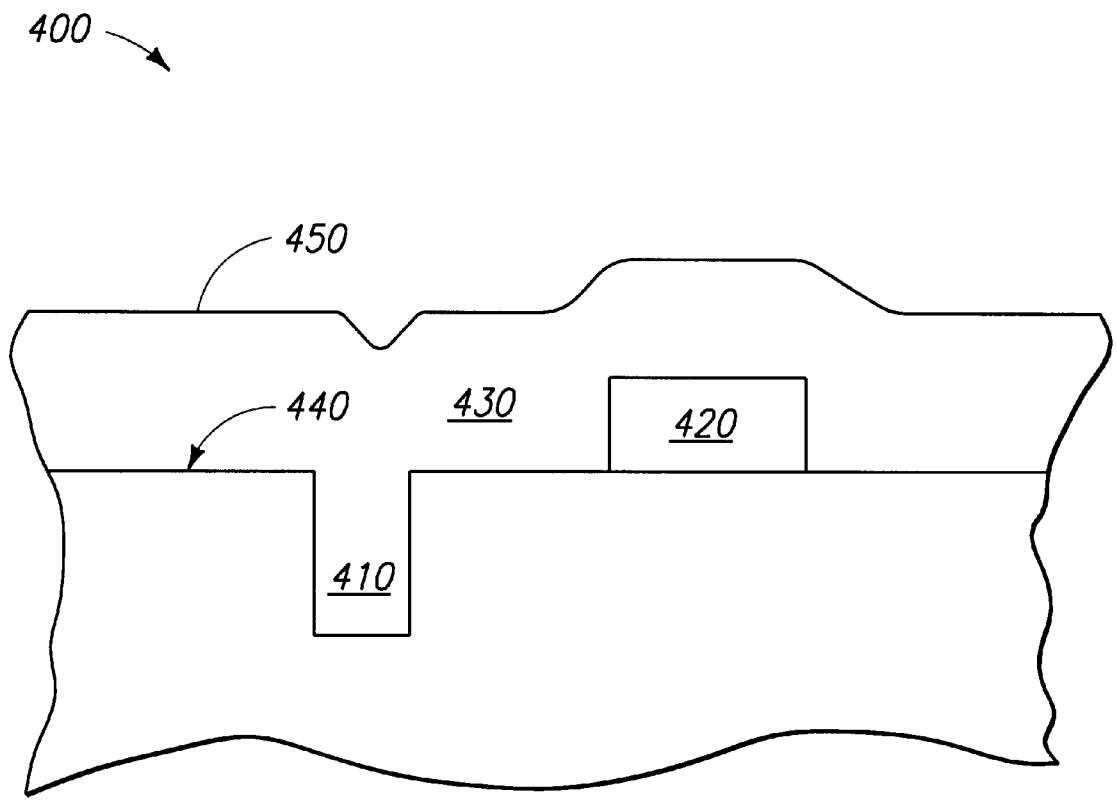
FIG. 4 is a side view of a portion of a wafer including a film to be polished using chemical mechanical polishing methods and apparatus in accordance with the present invention.

A portion of a wafer surface 400 including a filled trench 410, a feature 420, and a film 430 to be polished is schematically represented in FIG. 4. Device 310 is configured to provide a waveform that may be interpreted to determine a film thickness; e.g., the thickness of a film located between a surface 440 and top of film 450.

Machine 100 may also include a water spray system including a water nozzle 320, shown in FIG. 3. Nozzle 320 may be used to remove slurry and other debris on wafer 125 surface prior to film thickness measurement.

In accordance with an exemplary embodiment of the present invention, film 430 thickness is measured while wafer 125 is coupled to carrier 170. Unlike prior art methods of detecting film 430 endpoint (desired thickness) that continuously measures the film thickness with each oscillation of wafer 125 past the perimeter of pad 250, the methods according to the present invention include polishing wafer 125 for a predetermined amount of time, measuring the film thickness at the end of the amount of time, calculating an amount of time to continue polishing, and, if necessary, polishing for the calculated amount of time.

Figure 5:
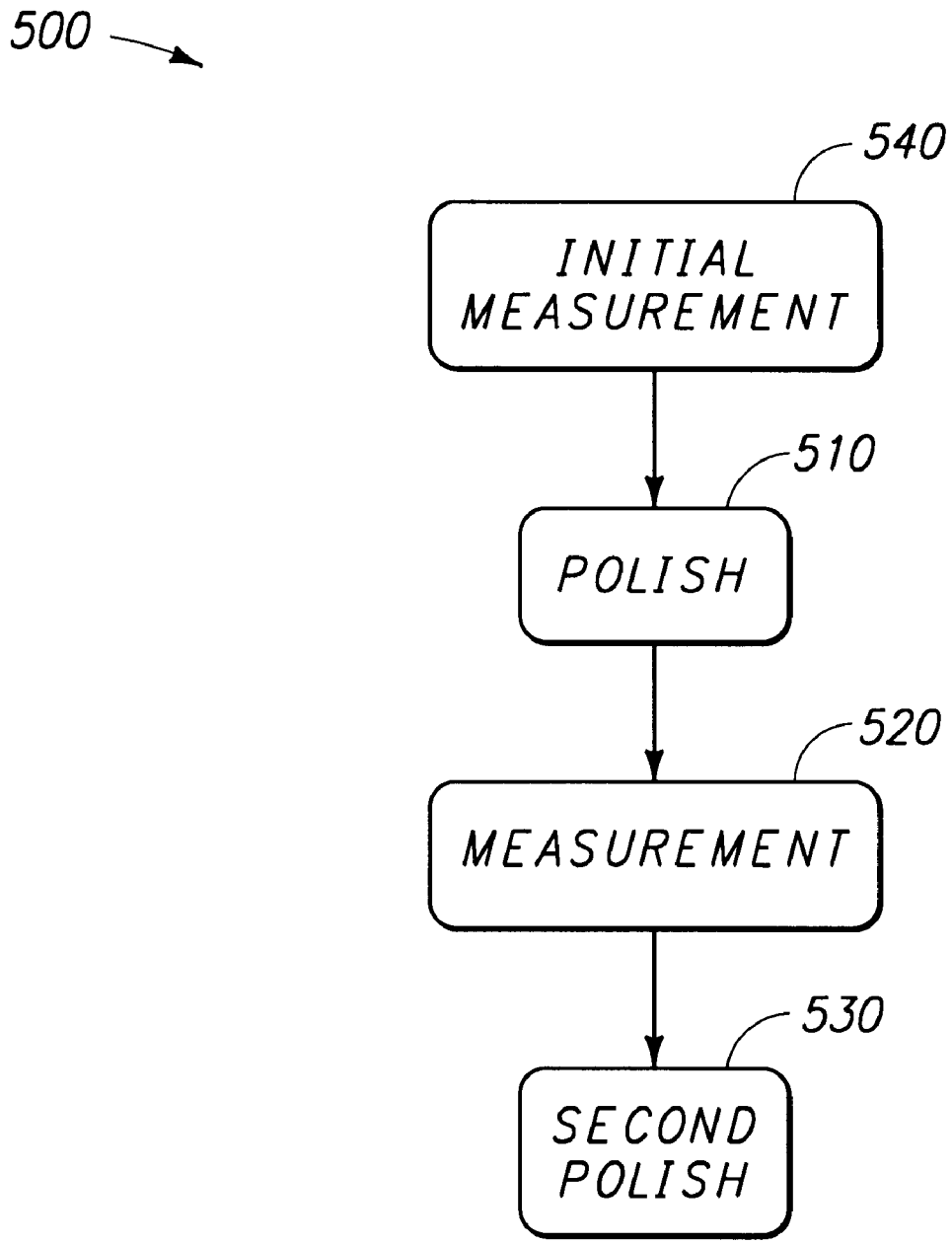
FIG. 5 is a schematic representation of a chemical mechanical polishing process in accordance with the present invention.

A chemical mechanical polishing process 500 in accordance with the present invention is illustrated in FIG. 5. Process 500 generally includes a polishing step 510, a measuring step 520 and a second polishing step 530. Process 500 may also suitably include an initial measuring step 540.

Polishing step 510 generally includes moving a surface 330 of wafer 125 relative to pad 250 in the presence of a slurry (not shown). As noted above, during step 510, polishing pad 250 rotates about an axis of platen 300 and wafer 125 rotates about its central axis and is translated back and forth over pad 250. In accordance with an exemplary embodiment of the present invention, polishing step is carried out for a predetermined amount of time. The predetermined time is preferably selected such that approximately a desired amount of material is removed from surface 330, leaving a desired amount of film 430 on surface 330. Although the amount of material removed during step 510 may vary from application to application, in accordance with an exemplary embodiment of the present invention, step 510 is configured to remove about 95% of the total amount of material to be removed with process 500.

At the completion of step 510, wafer 125 is moved proximate the perimeter of platen 300 and the pressure applied to wafer 125 during step 510 is reduced. In accordance with an exemplary embodiment of the present invention, the pressure applied to wafer 125 is reduced from about 3.5 psi during polishing to about 1.0 psi. In addition, a vacuum may be applied between carrier 170 and wafer 125 to couple wafer 125 to carrier 170. Wafer 125 is then moved to a measurement location; for example, the center of wafer 125 may be moved to about 15 inches from the center of platen 300 to allow measurements on surface 330.

Once wafer 125 is moved to its measurement location, during step 520, film 430 is measured over a portion of surface 330. During step 520, wafer 125 may suitably be rotated, allowing measurements around a circular path. In addition, wafer 125, device 310 or a combination thereof may be moved relative to each other to allow film 430 measurements over a greater surface area. Although any number of measurements may be taken over any amount of surface 330 area, in accordance with an exemplary embodiment of the present invention, about 200 measurements are taken over an area of surface 330, wherein the area forms an annular ring with an inside radius of about 1.5 inches and an outside radius of about 3 inches for a wafer having a radius of about 4 inches.

After measurement step 520, step 530 is employed to remove material from surface 330 until a desired film 430 thickness is obtained. In accordance with various aspects of the invention, various process parameters such as pressure applied to wafer 125 during polishing, rotation speed of wafer 125, oscillation speed of wafer 125, platen 300 rotation speed, and the amount of time wafer 125 is polished may be adjusted to obtain the desired film 430 thickness at the completion of step 530. In addition, one or more previously defined polishing programs may be selected for subsequent polishing. Steps 520 and 530 may be repeated as desired until the desired film thickness is obtained.

In addition to the steps noted above, process 500 may include an initial measurement step 540. Initial measurement 540 step may be used to calculate a predetermined amount of polish time for step 510. In other words, the time selected for step 510 may be based on the initial thickness reading on one or more of wafers 125.

Although the present invention is set forth herein in the context of the appended drawing figures, it should be appreciated that the invention is not limited to the specific form shown. For example, while inventive method and apparatus are conveniently described as configured to remove silicon oxide films from a surface of a semiconductor wafer, removal of various other films from other surfaces are considered within the scope of this invention. In addition, various amounts of material may be removed with each polishing step according to the present invention. Various other modifications, variations, and enhancements in the design and arrangement of the chemical mechanical polishing methods and apparatus as set forth herein may be made without departing from the spirit and scope of the present invention as set forth in the appended claims.

What is claimed is:

1. A method for removing an amount of material from a workpiece surface to obtain a desired film thickness on the workpiece surface, the method comprising the steps of:

placing the workpiece surface in contact with a polishing surface;

applying pressure to cause the workpiece to contact said polishing surface;

moving said workpiece surface and said polishing surface relative to each other while in contact to remove material from said workpiece surface;

moving the workpiece away from a center of said polishing surface such that the workpiece is proximate a perimeter of said polishing surface;

reducing said pressure causing contact between the workpiece and the polishing surface;

moving the workpiece further from said center of said polishing surface such that at least a portion of the workpiece surface overhangs said polishing surface; and measuring a film thickness on said at least a portion of the workpiece surface which overhangs said polishing surface.

2. The method according to claim 1, further comprising the step of applying a second polishing step to the workpiece surface.

3. The method according to claim 2, further comprising selecting process conditions for said second polishing step.

4. The method according to claim 3, wherein said selecting process conditions step includes selecting an amount of time for said second polishing step.

5. The method according to claim 1, further comprising the step of coupling the workpiece to a carrier.

6. The method according to claim 5, wherein said coupling step includes applying a vacuum force between the workpiece and said carrier.

7. A method for obtaining a desired film thickness on a substrate, the method comprising the steps of:

polishing the substrate for an amount of time by placing the substrate in contact with a polishing material and moving said substrate and said polishing material relative to each other; and measuring a film thickness on said substrate using a white light device while the substrate is coupled to a carrier and in contact with said polishing material, and a center of said substrate is at least 14 inches from a center of said polishing material, and said polishing material has a longest dimension of about 32 inches.

8. The method according to claim 7, further comprising the step of calculating process conditions for a subsequent polish step.

9. The method according to claim 7, further comprising a second polishing step based on said measured film thickness.

* * * * *